(12) United States Patent
Utsumi et al.

(10) Patent No.: US 10,593,823 B2
(45) Date of Patent: Mar. 17, 2020

(54) OPTICAL APPARATUS

(71) Applicant: ROHM CO., LTD., Kyoto-shi, Kyoto (JP)

(72) Inventors: Hideyuki Utsumi, Kyoto (JP); Yuki Tanuma, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 35 days.

(21) Appl. No.: 16/061,937

(22) PCT Filed: Dec. 13, 2016

(86) PCT No.: PCT/JP2016/086992
§ 371 (c)(1),
(2) Date: Jun. 13, 2018

(87) PCT Pub. No.: WO2017/104635
PCT Pub. Date: Jun. 22, 2017

(65) Prior Publication Data
US 2018/0358503 A1    Dec. 13, 2018

(30) Foreign Application Priority Data

Dec. 14, 2015 (JP) ................... 2015-243358

(51) Int. Cl.
*H01L 31/173* (2006.01)
*G01V 8/12* (2006.01)
(Continued)

(52) U.S. Cl.
CPC .......... *H01L 31/173* (2013.01); *G01J 1/0437* (2013.01); *G01V 8/12* (2013.01);
(Continued)

(58) Field of Classification Search
CPC .................................... H01L 31/173
See application file for complete search history.

(56) References Cited

U.S. PATENT DOCUMENTS

| 5,811,797 A * | 9/1998 | Kobachi ........... H01L 31/167 250/239 |
| 6,835,923 B2 * | 12/2004 | Hamalainen ......... H03K 17/941 250/221 |

(Continued)

FOREIGN PATENT DOCUMENTS

| JP | 5-175545 A | 7/1993 |
| JP | 7-45859 A | 2/1995 |

(Continued)

OTHER PUBLICATIONS

International Search Report issued in PCT/JP2016/086992, dated Mar. 7, 2017 (2 pages).

*Primary Examiner* — Eugene Lee
(74) *Attorney, Agent, or Firm* — Hamre, Schumann, Mueller & Larson, P.C.

(57) ABSTRACT

An optical device includes a light-emitting unit and a light-receiving unit. The light-emitting unit emits light forward in a first direction. The light-emitting unit has a light-emitting-side through hole that causes light traveling backward in the first direction to pass through. The light-receiving unit is arranged backward in the first direction relative to the light-emitting unit. The light-receiving unit has a light receiver that receives light after the light has passed through the light-emitting-side through hole.

33 Claims, 8 Drawing Sheets

(51) Int. Cl.
 *G01J 1/04* (2006.01)
 *H01L 31/0203* (2014.01)
 *H01L 31/0232* (2014.01)
 *H01L 33/58* (2010.01)

(52) U.S. Cl.
 CPC .... *H01L 31/0203* (2013.01); *H01L 31/02327* (2013.01); *H01L 33/58* (2013.01)

(56) References Cited

U.S. PATENT DOCUMENTS

| | | | | |
|---|---|---|---|---|
| 7,755,029 | B2* | 7/2010 | Tang | G06F 3/0317 |
| | | | | 250/221 |
| 9,136,258 | B1 | 9/2015 | Wang et al. | |
| 9,733,357 | B2* | 8/2017 | Costello | G01S 7/4813 |
| 2006/0118807 | A1* | 6/2006 | Ives | H01L 25/167 |
| | | | | 257/99 |
| 2008/0011939 | A1* | 1/2008 | Yee | H05B 33/08 |
| | | | | 250/214 AL |
| 2008/0049210 | A1* | 2/2008 | Takaoka | G01B 11/026 |
| | | | | 356/3 |
| 2011/0297831 | A1* | 12/2011 | Yao | G01S 7/4813 |
| | | | | 250/338.4 |
| 2013/0341650 | A1 | 12/2013 | Peng | |
| 2015/0279827 | A1* | 10/2015 | Tu | H01L 31/0232 |
| | | | | 257/81 |

FOREIGN PATENT DOCUMENTS

| | | |
|---|---|---|
| JP | 9-148620 A | 6/1997 |
| JP | 2010-114114 A | 5/2010 |

* cited by examiner

OPTICAL APPARATUS

FIELD OF THE INVENTION

The present invention relates to an optical apparatus, in particular to an optical apparatus having a light-emitting and light-receiving function.

BACKGROUND ART

Patent document 1 discloses a photointerrupter as an example of a conventional optical device. The photointerrupter includes a light-emitting element and a light-receiving element that are mounted on a substrate. The light emitted from the light-emitting element is received by the light-receiving element after being reflected by a detection target. This makes it possible to detect that the detection object is located opposite to the photointerrupter.

The above-noted photointerrupter may be incorporated in an electronic apparatus for use. In such a case, it is necessary to provide a common opening in the casing of the electronic apparatus, so that the light emitted from the light-emitting element and the light received by the light-receiving element can pass through the opening. It is desirable for this opening to be small in view of, for example, protection of components within the electronic apparatus. However, conventional photointerrupters still have room for improvement in terms of reducing the size of an opening.

PRIOR ART DOCUMENT

Patent Document 1: JP-A-2010-114114

SUMMARY OF THE INVENTION

Problems to be Solved by the Invention

The present invention has been proposed under the above-described circumstances, and an object of the invention is to provide an optical device or apparatus capable of downsizing the opening for light transmission in an electronic apparatus or the like.

Means to Solve the Problem

An optical device provided according to an aspect of the present invention includes a light-emitting unit that emits light forward in a first direction; and a light-receiving unit arranged backward in the first direction relative to the light-emitting unit. The light-emitting unit has a light-emitting-side through hole that causes light traveling backward in the first direction to pass through. The light-receiving unit has a light receiver for receiving light having passed through the light-emitting-side through hole.

Preferably, the light-emitting unit may include: a light-emitting-side base member having a light-emitting-side obverse surface that faces forward in the first direction, a light-emitting-side reverse surface that faces backward in the first direction, and a light-emitting-side recess recessed from the light-emitting-side obverse surface; light-emitting-side wiring formed on the light-emitting-side base member; and a light-emitting element housed in the light-emitting-side recess, wherein the light-emitting-side through hole may be connected to the light-emitting-side obverse surface and the light-emitting-side reverse surface.

Preferably, the light-emitting-side obverse surface and the light-emitting side reverse surface may be perpendicular to the first direction.

Preferably, the light-emitting-side recess may have a light-emitting-side recess bottom surface that faces forward in the first direction, and a light-emitting-side recess side surface that connects the light-emitting-side obverse surface and the light-emitting-side recess bottom surface.

Preferably, the light-emitting-side recess side surface may be parallel to the first direction.

Preferably, the light-emitting-side recess side surface may be inclined relative to the first direction.

Preferably, the light-emitting-side wiring may have a light-emitting-side bottom surface portion formed on the light-emitting-side recess bottom surface.

Preferably, the light-emitting element may be bonded to the light-emitting-side bottom surface portion.

Preferably, the light-emitting-side wiring may have a light-emitting-side side surface portion formed on the light-emitting-side recess side surface.

Preferably, the light-emitting-side wiring may have a light-emitting-side through portion that extends from the light-emitting-side recess to the light-emitting-side wiring.

Preferably, the light-emitting-side wiring may have a light-emitting-side reverse surface portion that is formed on the light-emitting-side reverse surface and electrically connected to the light-emitting-side through portion.

Preferably, an inner surface of the light-emitting-side through hole may be parallel to the first direction.

Preferably, the inner surface of the light-emitting-side through hole may be inclined relative to the first direction.

Preferably, the light-emitting unit may include a light-emitting-side light-transmissive resin, and the light-transmissive resin fills the light-emitting-side recess, covers the light-emitting element, and transmits light from the light-emitting element.

Preferably, the light-emitting-side light-transmissive resin may have a light-emitting-side lens portion.

Preferably, the light-emitting-side light-transmissive resin may have a light-emitting-side inclined surface that is inclined relative to the light-emitting-side obverse surface.

Preferably, the light-receiving unit may include: a light-receiving-side base member having a light-receiving-side obverse surface that faces forward in the first direction, a light-receiving-side reverse surface that faces backward in the first direction, and a light-receiving-side recess recessed from the light-receiving-side obverse surface; light-receiving-side wiring formed on the light-receiving-side base member; and a light-receiving element housed in the light-receiving-side recess and having the light-receiver.

Preferably, the light-receiving-side obverse surface and the light-receiving-side reverse surface may be perpendicular to the first direction.

Preferably, the light-receiving-side recess may have a light-receiving-side recess bottom surface that faces forward in the first direction, and a light-receiving-side recess side surface that connects the light-receiving-side obverse surface and the light-receiving-side recess bottom surface.

Preferably, the light-receiving-side recess side surface may be parallel to the first direction.

Preferably, the light-receiving-side wiring may have a light-receiving-side bottom surface portion formed on the light-receiving-side recess bottom surface.

Preferably, the light-receiving unit may include a light-receiving-side wire connecting the light-receiving element and the light-receiving-side bottom surface portion.

Preferably, the light-receiving-side wiring may have a light-receiving-side through portion that extends from the light-receiving-side recess to the light-receiving-side reverse surface.

Preferably, the light-receiving-side wiring may have a light-receiving-side reverse surface portion that is formed on the light-receiving-side reverse surface and electrically connected to the light-receiving-side through portion.

Preferably, the light-receiving unit may include a light-receiving-side light-transmissive resin, and the light-transmissive resin fills the light-receiving-side recess, covers the light-receiving element, and transmits light that is to be received by the light receiver.

Preferably, the light-receiving-side light-transmissive resin may have a light-receiving-side lens portion.

Preferably, the light-receiving-side light-transmissive resin may have a light-receiving-side inclined surface that is inclined relative to the light-receiving-side obverse surface.

Preferably, the light-receiving-side light transmissive resin may have a through-hole portion that passes through the light-emitting-side through hole and is exposed at the light-emitting-side obverse surface.

Preferably, the light-receiving-side light-transmissive resin may have a light-receiving-side lens portion formed at a forward end of the through-hole portion in the first direction.

Preferably, the light-receiving-side light-transmissive resin may have a light-receiving-side inclined surface formed at a forward end of the through-hole portion in the first direction.

Preferably, the optical device may further comprise a bonding material that bonds the light-emitting-side reverse surface of the light-emitting-side base member and the light-receiving-side reverse surface of the light-receiving-side base member.

Preferably, the bonding material may be an anisotropic conductive bonding material.

Preferably, the bonding material may be solder.

Preferably, the optical device may further comprise a light-transmissive cover, the cover being arranged forward in the first direction relative to the light-emitting-side base member, covering the light-emitting-side recess and the light-emitting-side through hole, and transmitting light from the light-emitting element.

Preferably, the light-transmissive cover may have a light-emitting-side lens portion that transmits light from the light-emitting element.

Preferably, the light-transmissive cover may have a light-receiving-side lens portion that transmits light that travels toward the light-emitting-side through hole.

Preferably, the light-receiving unit may be composed of a light-receiving element having the light-receiver.

Effect of the Invention

According to the optical device of the present invention, light emitted from the light emitter of the light-emitting unit is reflected by a detection target, and the reflected light reaches the light receiver via the light-emitting-side through hole. The light emitter and the light receiver are arranged at different positions in a predetermined direction (first direction). This can prevent interference between the light emitter and the light receiver, and the distance between the light emitter and the light receiver can be reduced in the x direction (direction perpendicular to the first direction). As a result, in an electronic apparatus or the like in which the optical device is mounted, an opening that allows light to pass through can be downsized.

Other features and advantages of the present invention will become more apparent from the detailed description given below with reference to the accompanying drawings.

MODE FOR CARRYING OUT THE INVENTION

Preferred embodiments of the present invention are described in detail below with reference to the drawings.

Figure 1:
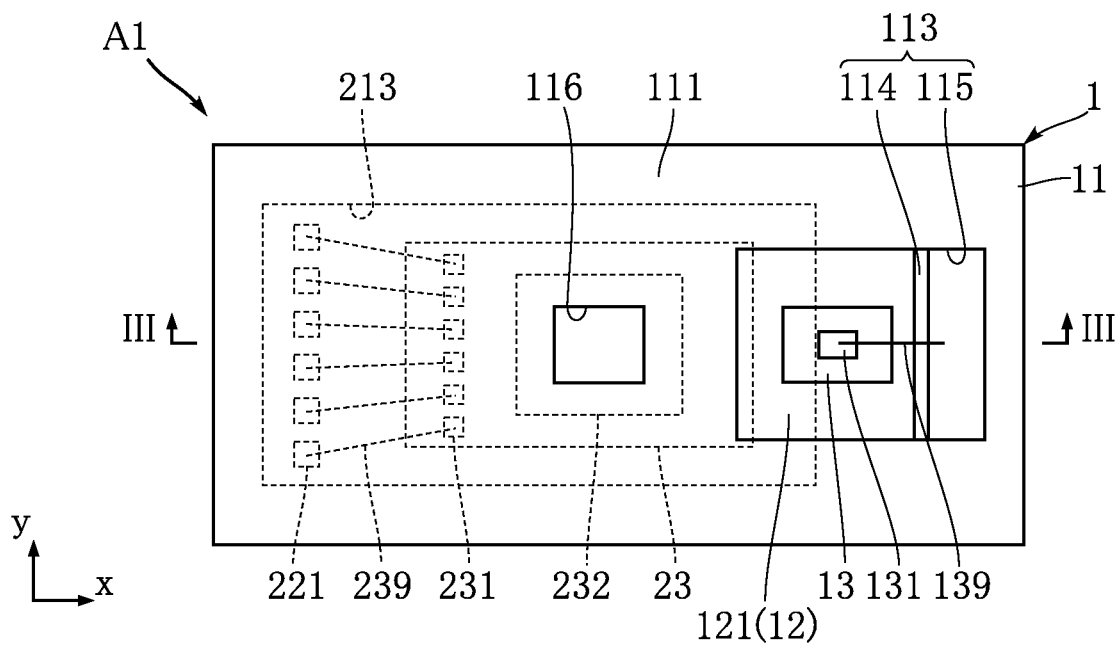
FIG. 1 is a plan view illustrating an optical device according to a first embodiment of the present invention.
Figure 2:
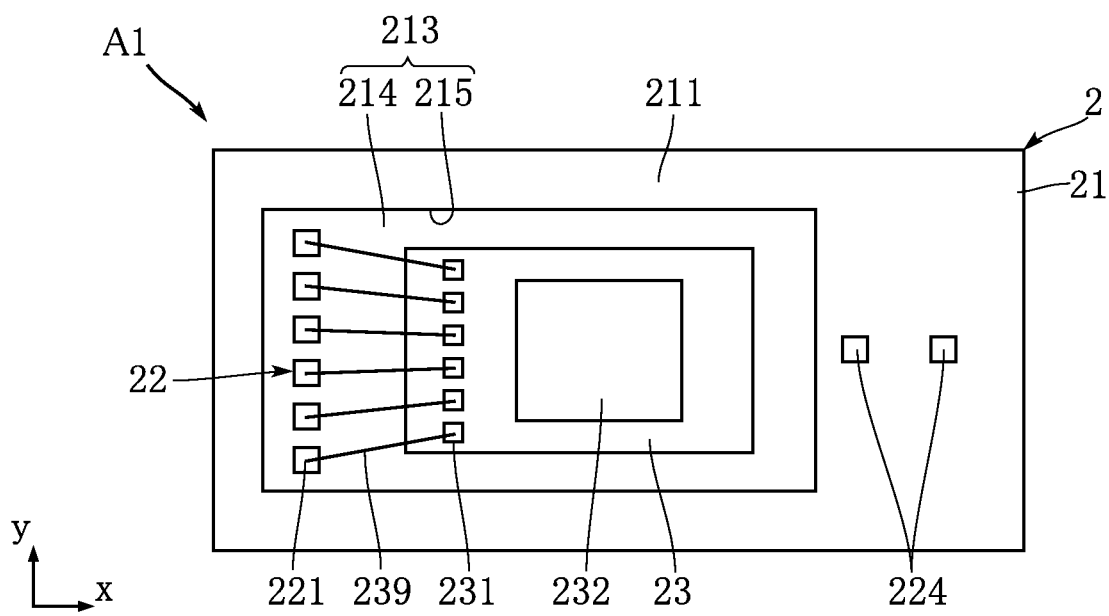
FIG. 2 is a plan view illustrating a main part of the optical device of FIG. 1.
Figure 3:
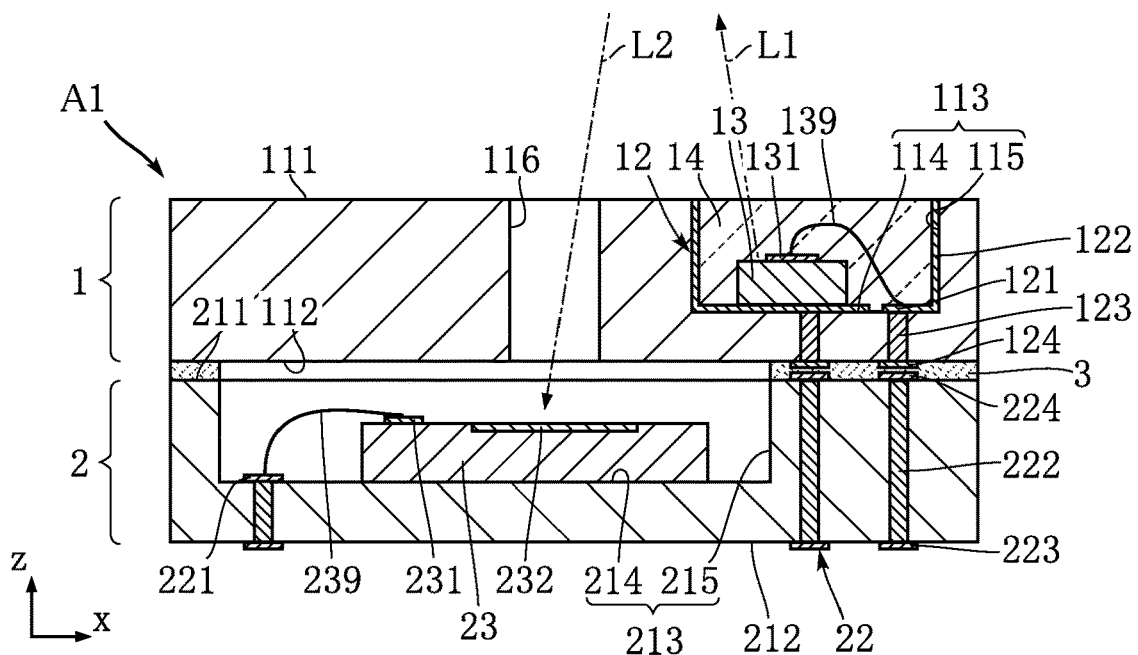
FIG. 3 is a cross-sectional view taken along line of FIG. 1.

FIGS. 1 to 3 illustrate an optical device according to a first embodiment of the present invention. The illustrated optical device A1 includes a light-emitting unit 1, a light-receiving unit 2, and a bonding material 3. The optical device A1 is a photointerrupter, which is configured to detect the presence of a detection target when the light emitted from the light-emitting unit 1 is reflected by the detection target and the reflected light is received by the light-receiving unit 2. As illustrated in FIG. 1, the optical device A1 is rectangular as viewed in the z direction, to which the present invention is not limited.

FIG. 1 is a plan view illustrating the optical device A1. FIG. 2 is a plan view illustrating a main part of the optical device A1 from which the light-emitting unit 1 and the light-receiving unit 2 are omitted. FIG. 3 is a cross-sectional view taken along line III-III of FIG. 1.

The light-emitting unit 1 has a light-emitting function for the optical device A1. In the present embodiment, the light-emitting unit 1 includes a light-emitting-side base member 11, light-emitting-side wiring 12, a light-emitting element 13, and a light-emitting-side light-transmissive resin 14.

The light-emitting-side base member 11 is a base for the light-emitting unit 1, and at least a surface layer thereof is made of an insulating material. Specific examples of the light-emitting-side base member 11 include a semiconductor substrate made of a semiconductor material such as Si, a ceramic substrate made of alumina or the like, a resin substrate made of glass epoxy resin or the like, but the present invention is not limited to these examples. For example, the resin substrate may comprise an MID substrate.

The light-emitting-side base member 11 has a light-emitting-side obverse surface 111, a light-emitting-side reverse surface 112, a light-emitting-side recess 113, and a light-emitting-side through hole 116.

The light-emitting-side obverse surface 111 faces forward in the z direction and is perpendicular to the z direction. The light-emitting-side reverse surface 112 faces backward in the z direction, and is perpendicular to the z direction.

The light-emitting-side recess 113 is recessed from the light-emitting-side obverse surface 111. The illustrated light-emitting-side recess 113 is rectangular as viewed in the z direction, to which the present invention is not limited. In the present embodiment, the light-emitting-side recess 113 has a light-emitting-side recess bottom surface 114 and a light-emitting-side recess side surface 115.

The light-emitting-side recess bottom surface 114 faces forward in the z direction, and is parallel to the light-emitting-side obverse surface 111. The light-emitting-side recess side surface 115 connects the light-emitting-side recess bottom surface 114 and the light-emitting-side obverse surface 111. The light-emitting-side recess side surface 115 is parallel to the z direction.

The light-emitting-side wiring 12 is formed on the light-emitting-side base member 11 and provides a conductive path for supplying power to the light-emitting element 13. For example, the light-emitting-side wiring 12 may be made of one or more types of metals selected appropriately from among Cu, Ni, Ti, and Au, and may be formed by plating.

In the present embodiment, the light-emitting-side wiring 12 has a light-emitting-side bottom surface portion 121, a light-emitting-side side surface portion 122, light-emitting-side through portions 123, and light-emitting-side reverse surface portions 124.

The light-emitting-side bottom surface portion 121 covers the light-emitting-side recess bottom surface 114. As illustrated in FIGS. 2 and 3, the light-emitting-side bottom surface portion 121 includes two regions, which are partitioned by a slit extending in the y direction and separate from each other in the x direction.

The light-emitting-side side surface portion 122 covers the light-emitting-side recess side surface 115. Similarly to the light-emitting-side bottom surface portion 121, the light-emitting-side side surface portion 122 includes two regions, which are partitioned by a slit extending in the z direction and separate from each other in the x direction.

The light-emitting-side through portions 123 penetrate through the light-emitting-side base member 11 from the light-emitting-side recess bottom surface 114 to the light-emitting-side reverse surface 112. In the illustrated example, two light-emitting-side through portions 123 are provided.

The two light-emitting-side through portions 123 are respectively connected to the two regions of the light-emitting-side bottom surface portion 121.

The light-emitting-side reverse surface portions 124 are provided on the light-emitting-side reverse surface 112. In the illustrated example, two light-emitting-side reverse surface portions 124 are provided. The two light-emitting-side reverse surface portions 124 are respectively provided on the two light-emitting-side through portions 123.

The light-emitting element 13 is a light source for the light-emitting unit 1. Specific examples of the light-emitting element 13 include an LED element, an LD element, and a VCSEL element. The illustrated light-emitting element 13 may be an LED element that emits infrared light.

The light-emitting element 13 has a light-emitting-element electrode 131. The light-emitting element 13 has a reverse-surface electrode (not illustrated). This reverse-surface electrode is bonded to one of the regions of the light-emitting-side bottom surface portion 121 by a conductive bonding material. The light-emitting-element electrode 131 and the other region of the light-emitting-side bottom surface portion 121 are connected by a light-emitting-side wire 139. The light-emitting-side wire 139 is made of Au, for example.

The light-emitting-side light-transmissive resin 14 fills the light-emitting-side recess 113 and covers the light-emitting element 13. The light-emitting-side light-transmissive resin 14 is made of a material that transmits light from the light-emitting element 13. In the illustrated example, the surface of the light-emitting-side light-transmissive resin 14 that faces forward in the z direction is either flat or slightly recessed backward in the z direction.

The light-receiving unit 2 has a light-receiving function for the optical device A1. In the present embodiment, the light-receiving unit 2 includes a light-receiving-side base member 21, light-receiving-side wiring 22, and a light-receiving element 23.

The light-receiving-side base member 21 is a base for the light-receiving unit 2, and at least a surface layer thereof is made of an insulating material. Specific examples of the light-receiving-side base member 21 include a semiconductor substrate made of a semiconductor material such as Si, a ceramic substrate made of alumina or the like, a resin substrate made of glass epoxy resin or the like, but the present invention is not limited to these examples. For example, the resin substrate may comprise an MID substrate.

The light-receiving-side base member 21 includes a light-receiving-side obverse surface 211, a light-receiving-side reverse surface 212, and a light-receiving-side recess 213.

The light-receiving-side obverse surface 211 faces forward in the z direction and is perpendicular to the z direction. The light-receiving-side reverse surface 212 faces backward in the z direction, and is perpendicular to the z direction.

The light-receiving-side recess 213 is recessed from the light-receiving-side obverse surface 211. The light-receiving-side recess 213 is rectangular as viewed in the z direction, to which the present invention is not limited. In the present embodiment, the light-receiving-side recess 213 has a light-receiving-side recess bottom surface 214 and a light-receiving-side recess side surface 215.

The light-receiving-side recess bottom surface 214 faces forward in the z direction, and is parallel to the light-receiving-side obverse surface 211. The light-receiving-side recess side surface 215 connects the light-receiving-side recess bottom surface 214 and the light-receiving-side obverse surface 211. The light-receiving-side recess side surface 215 is parallel to the z direction.

The light-receiving-side wiring 22 is formed on the light-receiving-side base member 21 and provides a conductive path that is electrically connected to the light-receiving element 23. For example, the light-receiving-side wiring 22 may be made of one or more types of metals selected appropriately from among Cu, Ni, Ti, and Au, and may be formed by plating.

In the present embodiment, the light-receiving-side wiring 22 has light-receiving-side bottom surface portions 221, light-receiving-side through portions 222, light-receiving-side reverse surface portions 223, and light-receiving-side obverse surface portions 224.

The light-receiving-side bottom surface portion 221 is formed on the light-receiving-side recess bottom surface 214. As illustrated in FIGS. 1 and 2, in the illustrated example, a plurality of light-receiving-side bottom surface portions 221 are provided. The plurality of light-receiving-side bottom surface portions 221 are arranged, for example, in the y direction on one side of the light-receiving-side recess bottom surface 214 in the x direction.

The light-receiving-side obverse surface portions 224 are provided on the light-receiving-side base member 21. In the illustrated example, two light-receiving-side obverse surface portions 224 are provided. The two light-receiving-side obverse surface portions 224 are provided at positions overlapping with the two light-emitting-side reverse surface portions 124 of the light-emitting unit 1 as viewed in the z direction.

The light-receiving-side through portions 222 penetrate through the light-receiving-side base member 21 upward (to the light-receiving-side obverse surface 211) from the light-receiving-side reverse surface 212. In the illustrated example, a plurality of light-receiving-side through portions 222 are provided. Among these, two relatively long light-receiving-side through portions 222 are respectively connected to the two light-receiving-side obverse surface portions 224. The other relatively short light-receiving-side through portions 222 are respectively connected to the plurality of light-receiving-side bottom surface portions 221.

The light-receiving-side reverse surface portions 223 are provided on the light-receiving-side reverse surface 212. In the illustrated example, a plurality of light-receiving-side reverse surface portions 223 are provided. Among these, two light-receiving-side reverse surface portions 223 are respectively connected to the two light-receiving-side through portions 222. The other light-receiving-side reverse surface portions 223 are respectively connected to the plurality of light-receiving-side through portions 222 that are connected to the plurality of light-receiving-side bottom surface portions 221. The plurality of light-receiving-side reverse surface portions 223 may be used as mounting terminals when the optical device A1 is mounted on a circuit board of an electronic device or the like.

The light-receiving element 23 has a light-receiving function for the light-receiving unit 2. Specific examples of the light-receiving element 23 include a phototransistor, a photodiode, and a photo IC. The illustrated light-receiving element 23 may be a photo IC. The light-receiving element 23 is bonded to the light-receiving-side recess bottom surface 214 by a bonding member (not illustrated). The light-receiving element 23 has a plurality of light-receiving-element electrodes 231 and a light receiver 232.

The light receiver 232 receives light. The light-receiving element 23 has a function of photoelectric conversion for generating an electromotive force corresponding to the light received by the light receiver 232.

The plurality of light-receiving-element electrodes 231 are respectively connected to the plurality of light-receiving-side bottom surface portions 221 by a plurality of light-receiving-side wires 239. The light-receiving-side wires 239 are made of Au, for example.

The bonding material 3 bonds the light-emitting unit 1 and the light-receiving unit 2. In the present embodiment, the light-emitting-side reverse surface 112 of the light-emitting unit 1 is bonded to the light-receiving-side obverse surface 211 of the light-receiving unit 2. In the illustrated example, the bonding material 3 is an anisotropic conductive bonding material. This allows for the two light-emitting-side reverse surface portions 124 of the light-emitting unit 1 and the two light-receiving-side obverse surface portions 224 of the light-receiving unit 2 to be electrically connected, respectively.

As illustrated in FIGS. 1 and 3, the light-emitting-side through hole 116 of the light-emitting unit 1 overlaps with the light receiver 232 of the light-receiving unit 2 as viewed in the z direction. In the illustrated example, the light-emitting-side through hole 116 entirely overlaps with the light receiver 232 as viewed in the z direction.

As illustrated in FIGS. 1 and 3, the light-emitting-side recess 113 and the light-receiving-side recess 213 partially overlap with each other as viewed in the z direction. Also, in the illustrated example, a part of the light-emitting element 13 overlaps with a part of the light-receiving-side recess 213. Furthermore, apart of the light-receiving element 23 overlaps with a part of the light-emitting-side recess 113.

In use, light L1 is emitted from the light-emitting element 13 of the light-emitting unit 1. If a detection target is located forward in the z direction, the light L1 is reflected by the detection target. Reflected light L2 passes through the light-emitting-side through hole 116 and is received by the light receiver 232. The light-receiving element 23 outputs a detection signal corresponding to the received light with the photoelectric conversion function.

Figure 4:
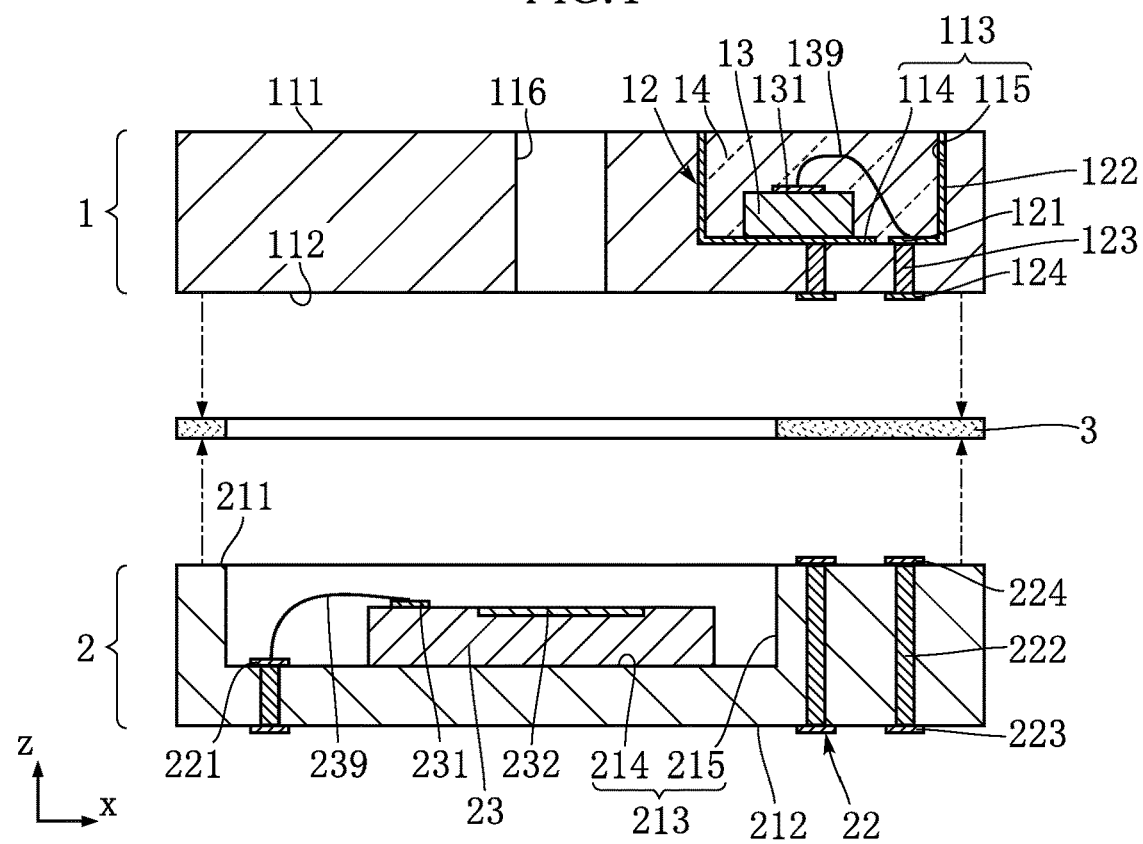
FIG. 4 is a cross-sectional view illustrating an example of a method for manufacturing the optical device of FIG. 1.

FIG. 4 illustrates a step in an example of a method for manufacturing the optical device A1. For example, after the light-emitting unit 1 and the light-receiving unit 2 are formed, the light-emitting-side reverse surface 112 and the light-receiving-side obverse surface 211 are bonded with the bonding material 3. Note that a light-emitting-side substrate material formed with a plurality of light-emitting units 1 may be bonded to a light-receiving-side substrate material formed with a plurality of light-receiving units 2, with a bonding material 3 larger than the illustrated bonding material, and the light-emitting-side substrate and the light-receiving-side substrate may be collectively cut off so as to manufacture a plurality of optical devices A1.

Next, advantages of the optical device A1 will be described.

According to the present embodiment, when the light L1 emitted from the light-emitting unit 1 is reflected by a detection target, the reflected light L2 passes through the light-emitting-side through hole 116 to reach the light receiver 232. The light emitter of the light-emitting unit 1 and the light receiver 232 of the light-receiving unit 2 are arranged at different positions in the z direction and are spaced apart from each other. This makes it possible to prevent interference between the light emitter of the light-emitting unit 1 and the light receiver 232 in the x direction and the y direction, and the distance between the light emitter and the light receiver 232 can be reduced in the x direction. As a result, in an electronic apparatus or the like in which the optical device A1 is mounted, an opening that allows the light L1 and the light L2 to pass through can be downsized.

As illustrated in FIG. 4, the optical device A1 may be manufactured by separately forming the light-emitting unit 1 and the light-receiving unit 2 and then bonding these units. This eliminates the need to arrange the light-emitting element 13 and the light-receiving element 23 in close proximity to each other on a single member. In this way, the optical device A1, which is small in size, can be easily manufactured.

The use of the light-emitting unit 1 having the light-emitting-side base member 11 and the light-receiving unit 2 having the light-receiving-side base member 21 allows for simplifying the manufacturing of the light-emitting unit 1 and the light-receiving unit 2.

Since the light-emitting element 13 is housed in the light-emitting-side recess 113, the light-emitting element 13 is prevented from protruding outward. Also, since the light-receiving element 23 is housed in the light-receiving-side recess 213, interference between the light-receiving element 23 and the light-emitting unit 1 can be prevented.

The light emitted from the light-emitting element 13 can be reflected by the light-emitting-side bottom surface portion 121 and the light-emitting-side side surface portion 122. This increases the luminance of the light-emitting unit 1.

Since the light-emitting-side through portions 123 are provided, the light-emitting-side reverse surface portions 124 that are electrically connected to the light-emitting element 13 can be arranged at the light-emitting-side reverse surface 112 of the light-emitting-side base member 11. This arrangement is advantageous in electrically connecting the light-receiving unit 2 and the light-emitting element 13 in a state where the light-emitting unit 1 and the light-receiving unit 2 are bonded together.

Since the light-emitting-side recess 113 and the light-receiving-side recess 213 partially overlap with each other in the x direction, the dimension of the optical device A1 in the x direction can be reduced. Furthermore, the configuration in which the light-emitting element 13 and the light-receiving-side recess 213 partially overlap with each other as viewed in the z direction, and the configuration in which the light-receiving element 23 and the light-emitting-side recess 113 overlap with each other as viewed in the z direction are preferable in downsizing the optical device A1.

FIGS. 5 to 16 illustrate other optical devices according to the present invention. In these figures, elements that are the same as or similar to those in the first embodiment are provided with the same reference signs.

Figure 5:
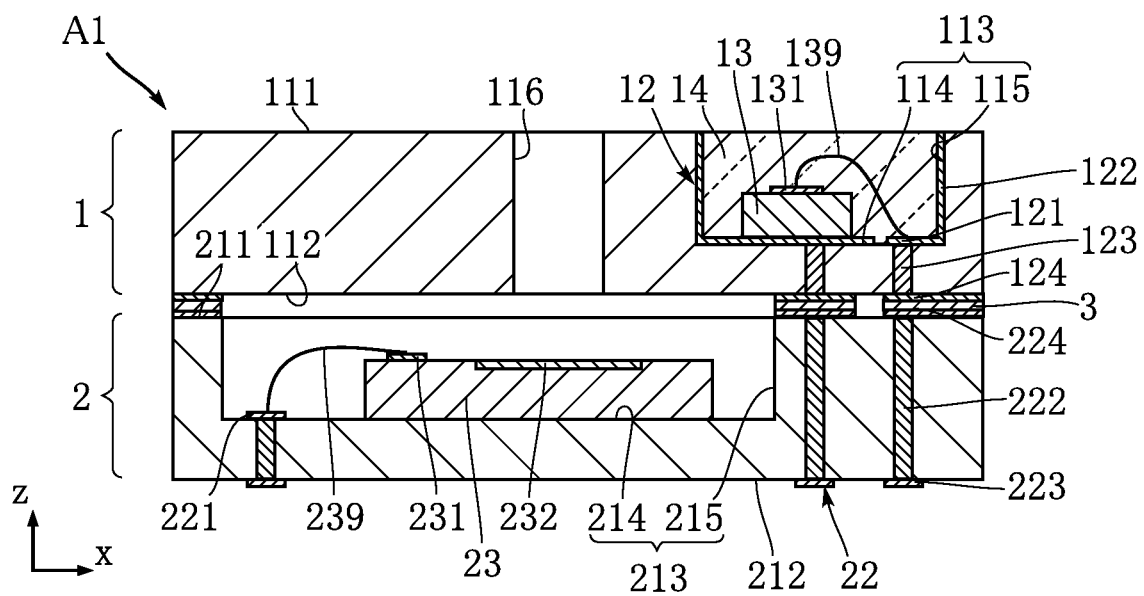
FIG. 5 is a cross-sectional view illustrating a variation of the optical device of FIG. 1.

FIG. 5 illustrates a variation of the optical device according to the first embodiment. In the optical device A1 according to the present variation, the bonding material 3 is solder. Accordingly, the two light-emitting-side reverse surface portions 124 and the two light-receiving-side obverse surface portions 224 are bonded by portions of the bonding material 3 that are spaced apart from each other. In addition, a portion of the light-emitting-side wiring 12 not electrically connected to the light-emitting element 13 is formed on the light-emitting-side reverse surface 112 of the light-emitting-side base member 11, and a portion of the light-receiving-side wiring 22 not electrically connected to either the light-emitting element 13 or the light-receiving element 23 is formed on the light-receiving-side obverse surface 211 of the light-receiving-side base member 21. These portions are bonded by the bonding material 3.

Such a variation as described above can downsize an opening that allows the light L1 and the light L2 to pass through, in an electronic apparatus or the like in which the optical device A1 is mounted. In the configurations described below, the bonding material 3 may be either an anisotropic conductive bonding material or solder as appropriate.

Figure 6:
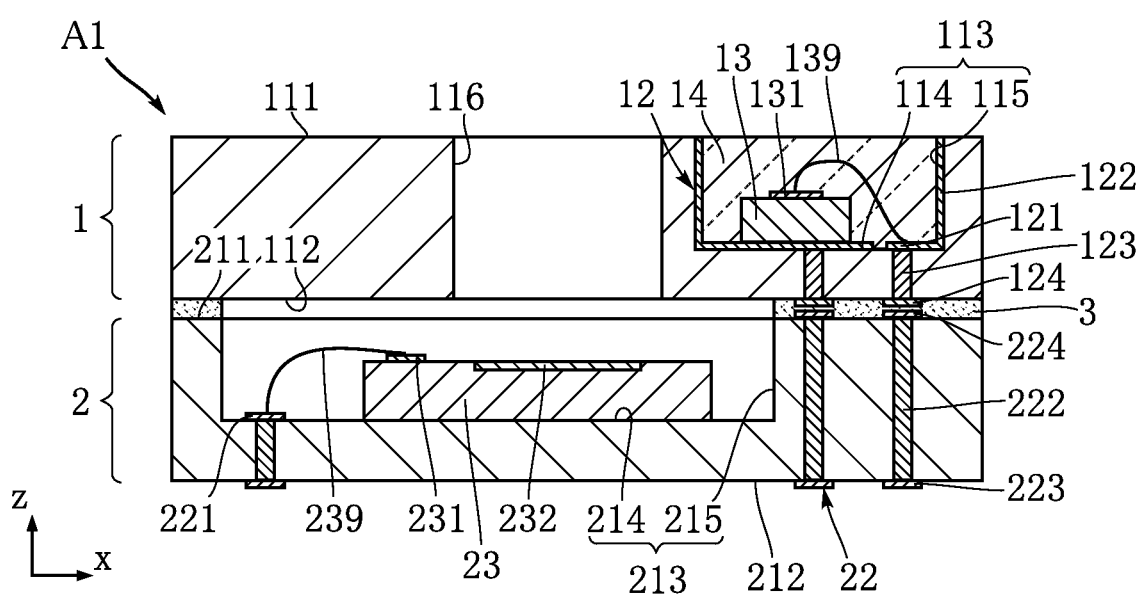
FIG. 6 is a cross-sectional view illustrating another variation of the optical device of FIG. 1.

FIG. 6 illustrates an optical device A1 according to another variation. In the present variation, the entirety of the light receiver 232 of the light-receiving element 23 in the light-receiving unit 2 is enclosed within the light-emitting-side through hole 116 of the light-emitting unit 1, as viewed in the z direction.

Such a variation as described above can downsize an opening that allows the light L1 and the light L2 to pass through, in an electronic apparatus or the like in which the optical device A1 is mounted. Alternatively, the light-emitting-side through hole 116 and the light receiver 232 may partially overlap with each other as viewed in the z direction.

Figure 7:
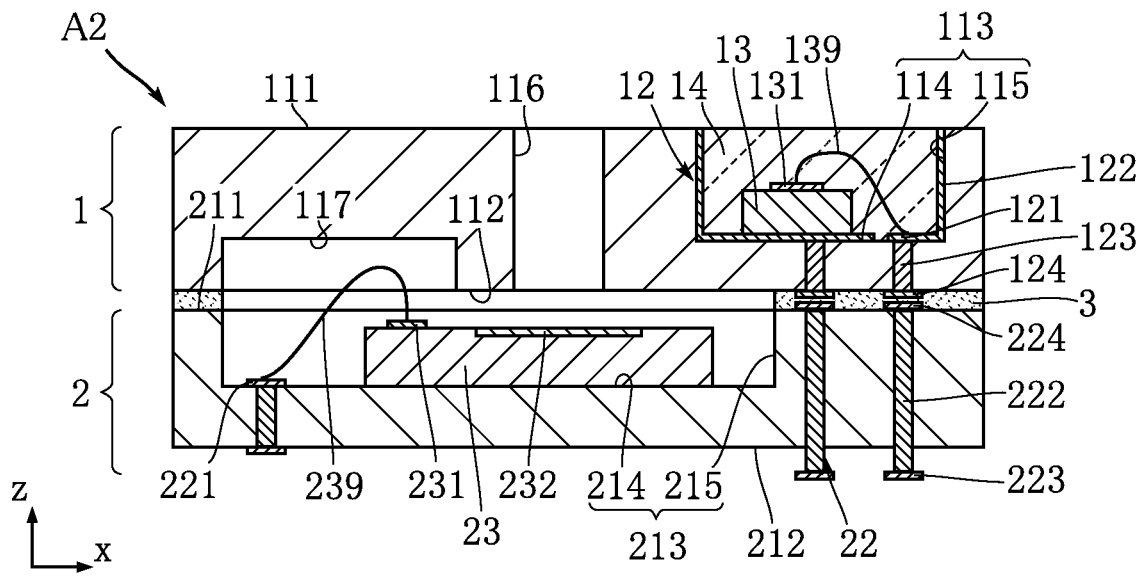
FIG. 7 is a cross-sectional view illustrating an optical device according to a second embodiment of the present invention.

FIG. 7 illustrates an optical device according to a second embodiment of the present invention. In the optical device A2 as illustrated, a light-emitting-side base member 11 of a light-emitting unit 1 is formed with a light-emitting-side reverse surface recess 117.

The light-emitting-side reverse surface recess 117 is recessed from a light-emitting-side reverse surface 112, and overlaps with at least portions of light-receiving-side wires 239 of a light-receiving unit 2 as viewed in the z direction. Also, the entirety of the light-emitting-side reverse surface recess 117 is enclosed within a light-receiving-side recess 213 of a light-receiving-side base member 21 as viewed in the z direction. Also, in the z direction, portions (forward portions in the z direction) of the light-receiving-side wires 239 are housed in the light-emitting-side reverse surface recess 117.

Such an embodiment as described above can downsize an opening that allows the light L1 and the light L2 to pass through, in an electronic apparatus or the like in which the optical device A2 is mounted. Also, since the light-receiving-side wires 239 are housed in the light-emitting-side reverse surface recess 117, interference between the light-receiving-side wires 239 and the light-emitting-side base member 11 can be prevented. Furthermore, since the light-emitting-side reverse surface recess 117 and the light-receiving-side wires 239 overlap with each other in the z direction, the dimension of the optical device A2 in the z direction can be reduced.

Figure 8:
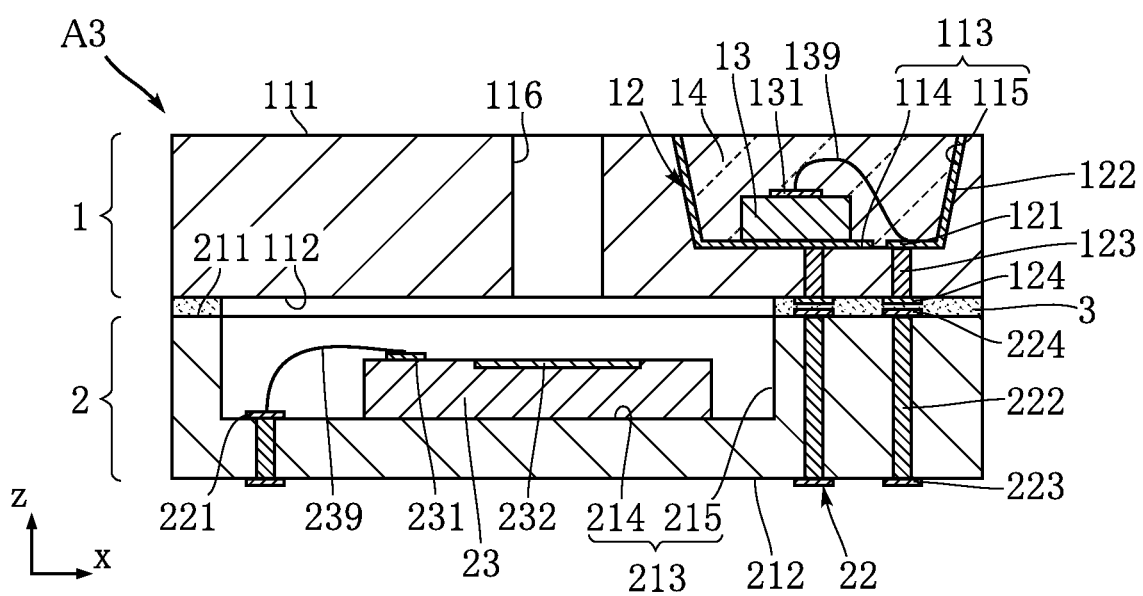
FIG. 8 is a cross-sectional view illustrating an optical device according to a third embodiment of the present invention.

FIG. 8 illustrates an optical device according to a third embodiment of the present invention. In the optical device A3 as illustrated, a light-emitting-side recess side surface 115 of a light-emitting-side base member 11 in a light-emitting unit 1 is inclined relative to the z direction. Specifically, the light-emitting-side recess side surface 115 is inclined such that the cross-sectional shape of a light-emitting-side recess 113 along the xy plane is larger toward a light-emitting-side obverse surface 111 from a light-emitting-side recess bottom surface 114 in the z direction.

Such an embodiment as described above can downsize an opening that allows the light L1 and the light L2 to pass through, in an electronic apparatus or the like in which the optical device A3 is mounted. Also, since the light-emitting-side recess side surface 115 is inclined, the light traveling sideways (in the x direction or y direction) from the light-emitting element 13 is reflected by the light-emitting-side side surface portion 122 and travels forward in the z direction. This is advantageous in increasing the luminance of the light-emitting unit 1, and is preferable in improving the detection accuracy of the optical device A3.

Figure 9:
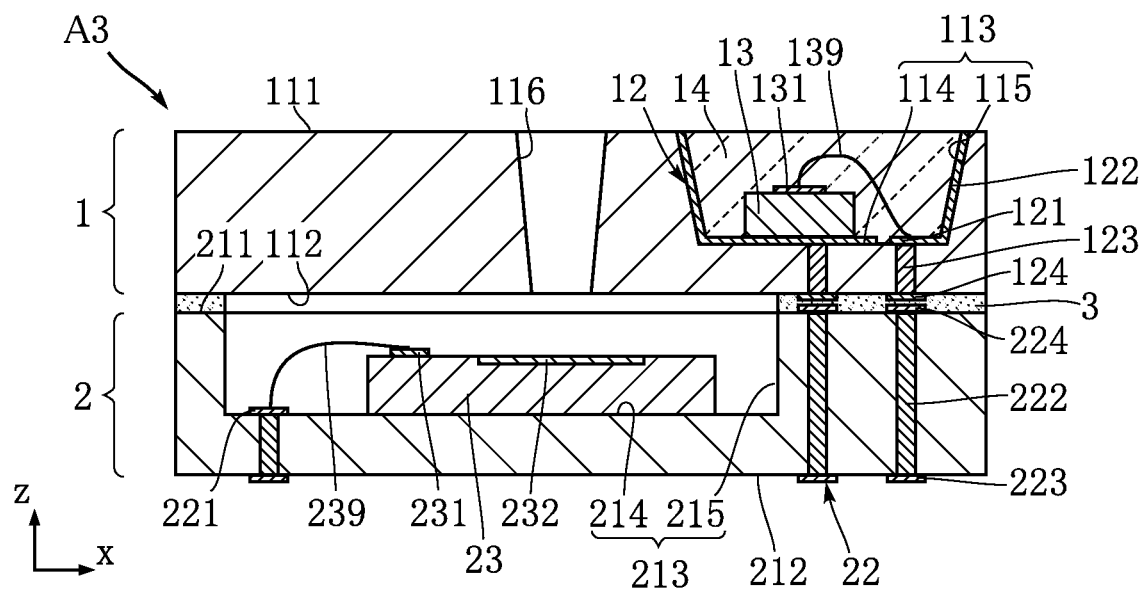
FIG. 9 is a cross-sectional view illustrating a variation of the optical device of FIG. 8.

FIG. 9 illustrates a variation of the optical device according to the third embodiment. In the optical device A3 according to the present variation, an inner surface of a light-emitting-side through hole 116 is inclined relative to the z direction. Specifically, the inner surface of the light-emitting-side through hole 116 is inclined such that the cross-sectional shape of the light-emitting-side through hole 116 along the xy plane is larger toward the light-emitting-side obverse surface 111 from a light-emitting-side reverse surface 112 in the z direction.

Such a variation as described above can downsize an opening that allows the light L1 and the light L2 to pass through, in an electronic apparatus or the like in which the optical device A3 is mounted. Also, since the inner surface of the light-emitting-side through hole 116 is inclined, incoming light from a wider area can reach a light receiver 232.

Figure 10:
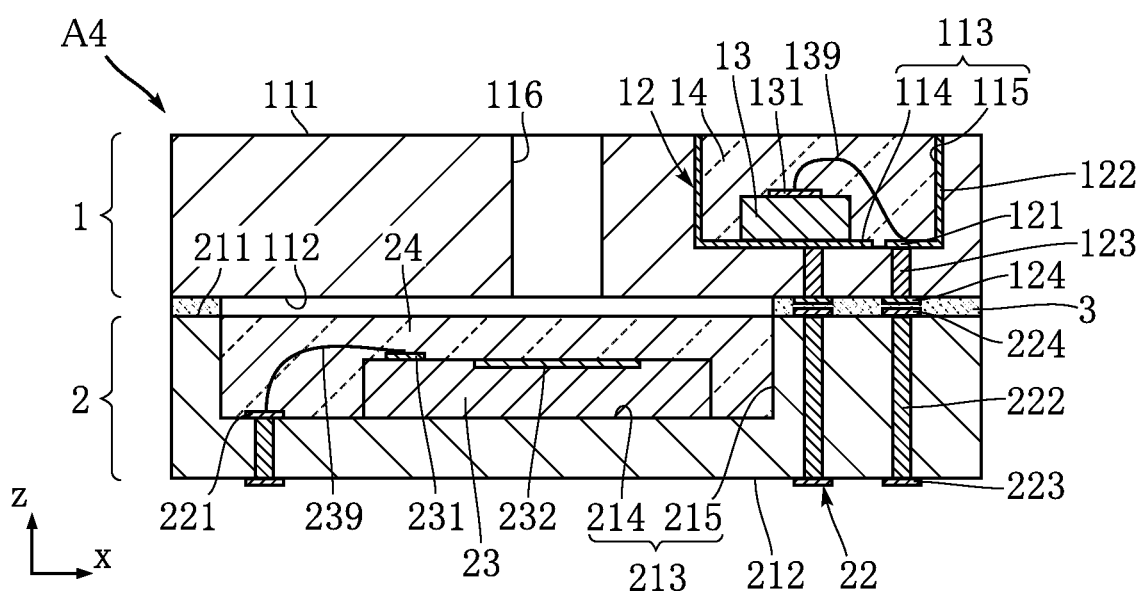
FIG. 10 is a cross-sectional view illustrating an optical device according to a fourth embodiment of the present invention.

FIG. 10 illustrates an optical device according to a fourth embodiment of the present invention. In the optical device A4 as illustrated, a light-receiving unit 2 includes a light-receiving-side light-transmissive resin 24.

The light-receiving-side light-transmissive resin 24 fills a light-receiving-side recess 213 and covers a light-receiving element 23. The light-receiving element 23 is made of a material that transmits light received by a light receiver 232. In the manufacturing of the optical device A4 of the present variation, the light-receiving-side light-transmissive resin 24 may be formed, for example, during the process of forming the light-receiving unit 2, by filling the light-receiving-side recess 213 with a light-transmissive resin material and curing the resin material.

Such an embodiment as described above can downsize an opening that allows the light L1 and the light L2 to pass through, in an electronic apparatus or the like in which the optical device A4 is mounted. Also, the light-receiving-side light-transmissive resin 24 can protect the light-receiving element 23.

Figure 11:
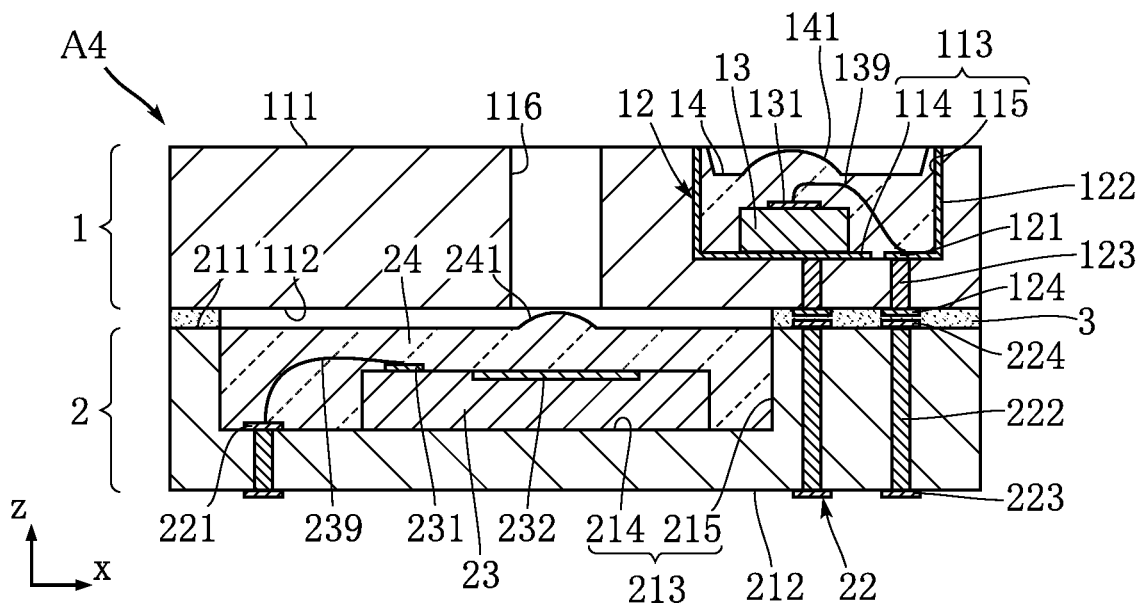
FIG. 11 is a cross-sectional view illustrating a variation of the optical device of FIG. 10.

FIG. 11 illustrates a variation of the optical device according to the fourth embodiment. In the optical device A4 according to the present variation, the light-receiving-side light-transmissive resin 24 is formed with a light-receiving side lens portion 241. The light-receiving-side lens portion 241 is located forward in the z direction relative to the light receiver 232, and overlaps with a light-emitting-side through hole 116 as viewed in the z direction. The light-receiving-side lens portion 241 bulges forward in the z direction.

Also, in the present variation, a light-emitting-side light-transmissive resin 14 is formed with a light-emitting-side lens portion 141. The light-emitting-side lens portion 141 is located forward in the z direction relative to a light-emitting element 13. The light-emitting-side lens portion 141 has a shape that bulges forward in the z direction.

Such a variation as described above can downsize an opening that allows the light L1 and the light L2 to pass through, in an electronic apparatus or the like in which the optical device A4 is mounted. The light-collecting effects of the light-emitting-side lens portion 141 and the light-receiving-side lens portion 241 can further enhance the detection of the optical device A4.

Figure 12:
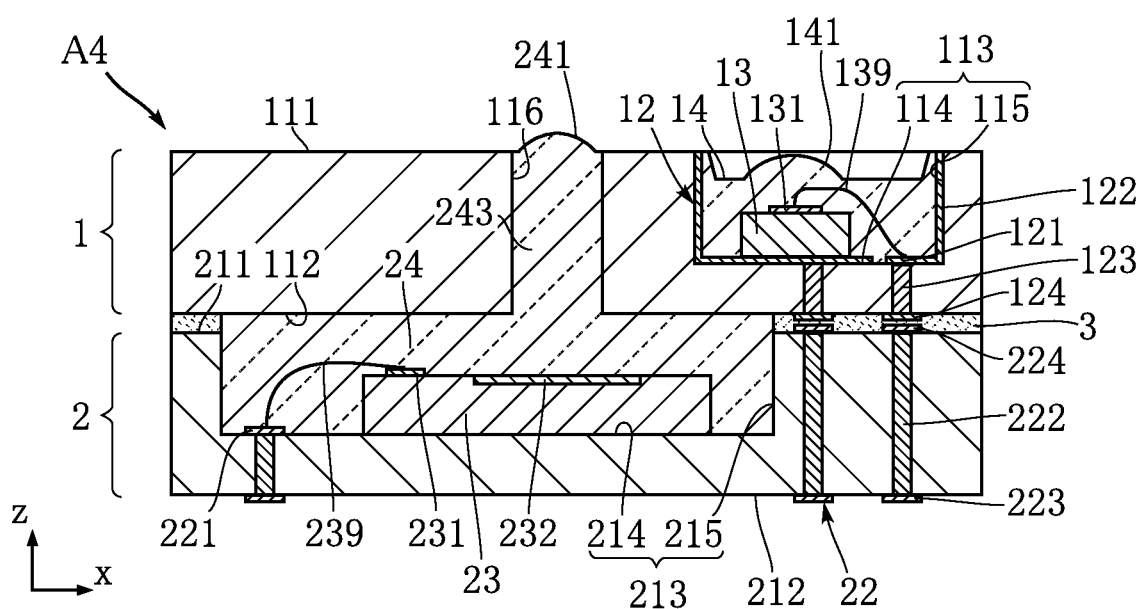
FIG. 12 is a cross-sectional view illustrating another variation of the optical device of FIG. 10.

FIG. 12 illustrates another variation of the optical device according to the fourth embodiment. In the optical device A4 according to the present variation, the light-receiving-side light-transmissive resin 24 has a through-hole portion 243. The through-hole portion 243 passes through the light-emitting-side through hole 116 and is exposed at a light-emitting-side obverse surface 111. In the illustrated example, the light-receiving-side lens portion 241 is formed at a forward end of the through-hole portion 243 in the z direction. In the manufacturing of the optical device A4 of the present variation, the light-receiving-side light-transmissive resin 24 may be formed, for example, by bonding a light-emitting unit 1 to the light-receiving unit 2 in which the light-receiving-side light-transmissive resin 24 has not yet been formed, and then filling the light-receiving-side recess 213 and the light-emitting-side through hole 116 with a light-transmissive resin material and curing the resin material.

Such a variation as described above can downsize an opening that allows the light L1 and the light L2 to pass through, in an electronic apparatus or the like in which the optical device A4 is mounted.

Figure 13:
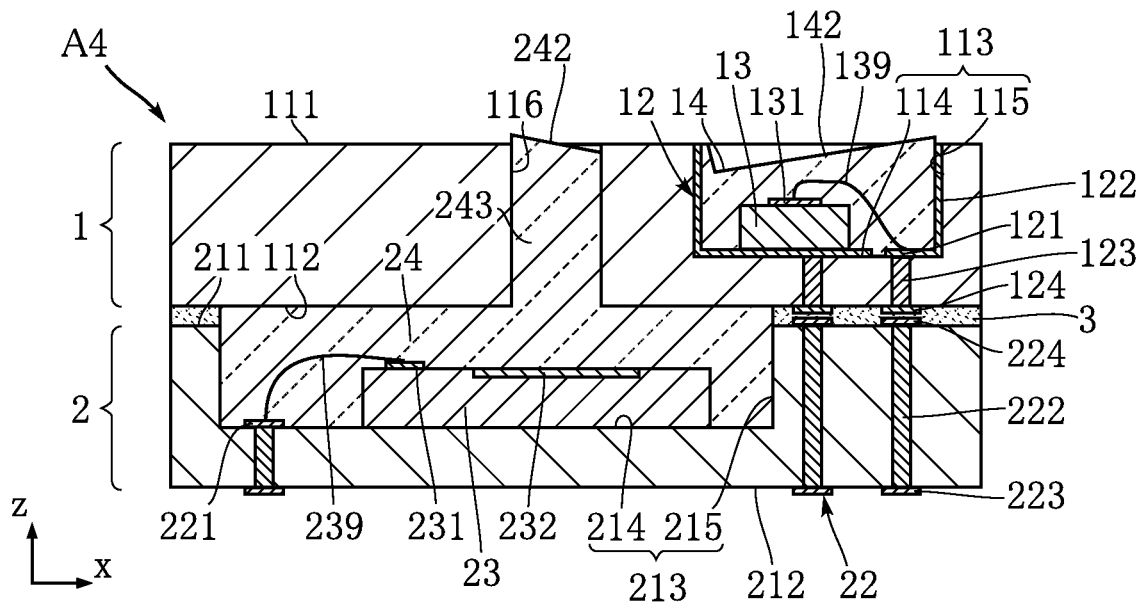
FIG. 13 is a cross-sectional view illustrating another variation of the optical device of FIG. 10.

FIG. 13 illustrates another variation of the optical device according to the fourth embodiment. In the optical device A4 according to the present variation, the light-emitting-side light-transmissive resin 14 is formed with a light-emitting-side inclined surface 142, and the light-receiving-side light-transmissive resin 24 is formed with a light-receiving-side inclined surface 242.

The light-emitting-side inclined surface 142 is located forward in the z direction relative to the light-emitting element 13. The light-emitting-side inclined surface 142 is inclined relative to the light-emitting-side obverse surface 111. In the illustrated example, the light-emitting-side inclined surface 142 is inclined more forward in the z direction toward the right side in the x direction.

The light-receiving-side inclined surface 242 is formed at a forward end of the through-hole portion 243 in the z direction. The light-receiving-side inclined surface 242 is inclined relative to the light-emitting-side obverse surface 111. In the illustrated example, the light-receiving-side inclined surface 242 is inclined more forward in the z direction toward the left side in the x direction.

Such a variation as described above can downsize an opening that allows the light L1 and the light L2 to pass through, in an electronic apparatus or the like in which the optical device A4 is mounted. Also, the light-emitting-side inclined surface 142 refracts light from the light-emitting element 13. This makes it possible to adjust the traveling direction of light from the light-emitting element 13. Also, the light-receiving-side inclined surface 242 refracts light approaching the light receiver 232. This makes it possible to adjust the direction in which light to be received by the light receiver 232 approaches. The directions and angles at which the light-emitting-side inclined surface 142 and the light-receiving-side inclined surface 242 are inclined may be changed appropriately depending on the direction and angle of light to be adjusted.

Figure 14:
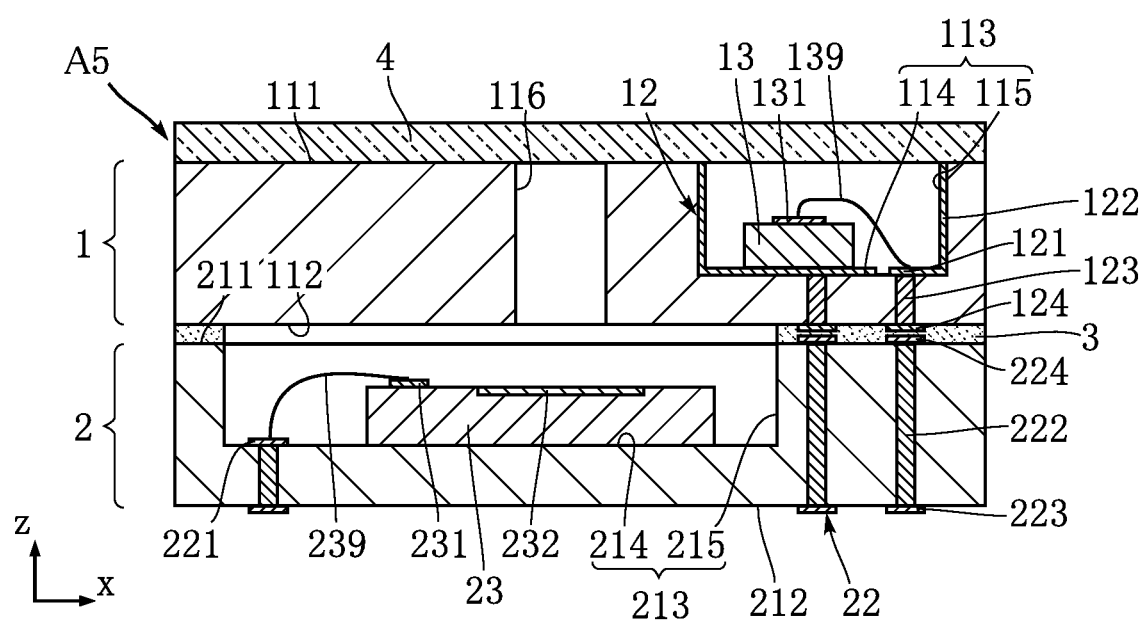
FIG. 14 is a cross-sectional view illustrating an optical device according to a fifth embodiment of the present invention.

FIG. 14 illustrates an optical device according to a fifth embodiment of the present invention. The illustrated optical device A5 includes a light-transmissive cover 4.

The light-transmissive cover 4 is arranged forward in a first direction relative to a light-emitting-side base member 11, and covers a light-emitting-side recess 113 and a light-emitting-side through hole 116. The light-transmissive cover 4 is made of a material that transmits light from the light-emitting element 13. Such a material may be a light-transmissive resin or glass. The light-transmissive cover 4 is bonded to a light-emitting-side obverse surface 111 of the light-emitting-side base member 11.

Such an embodiment as described above can downsize an opening that allows the light L1 and the light L2 to pass through, in an electronic apparatus or the like in which the optical device A5 is mounted. Also, the light-transmissive cover 4 can appropriately protect the light-emitting element 13 and a light-receiving element 23.

Figure 15:
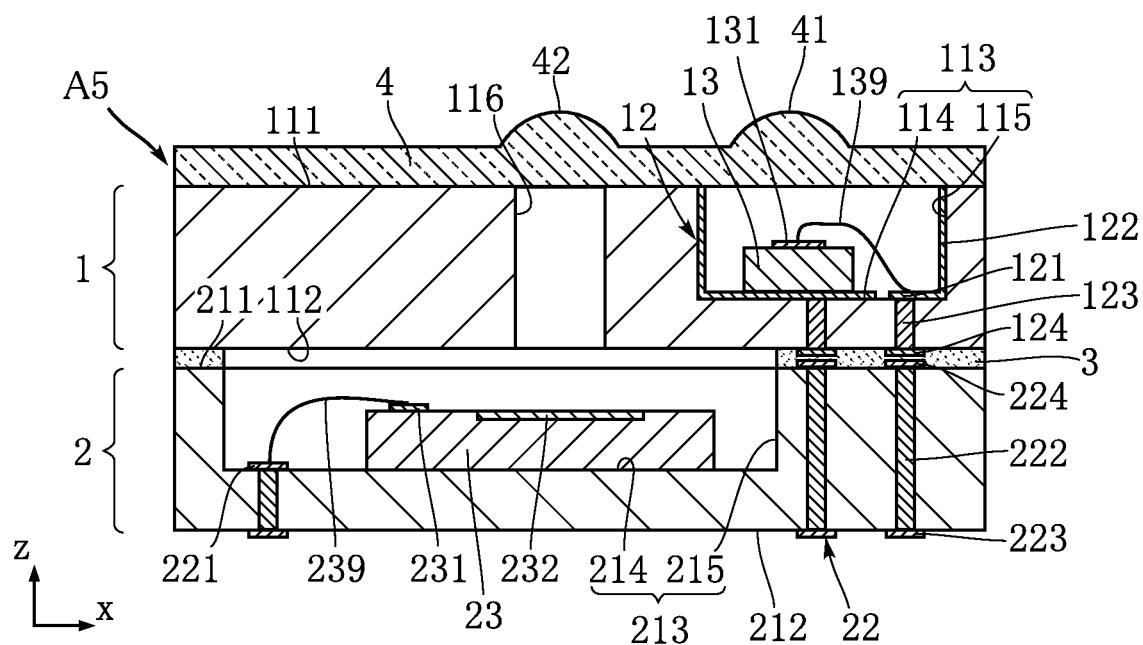
FIG. 15 is a cross-sectional view illustrating another variation of the optical device of FIG. 14.

FIG. 15 illustrates a variation of the optical device according to the fifth embodiment. In the optical device A5 according to the present variation, the light-transmissive cover 4 has a light-emitting-side lens portion 41 and a light-receiving-side lens portion 42.

The light-emitting-side lens portion 41 is arranged forward in the z direction relative to the light-emitting element 13. The light-emitting-side lens portion 41 bulges forward in the z direction. The light-receiving-side lens portion 42 is arranged forward in the z direction relative to the light-emitting-side through hole 116. The light-receiving-side lens portion 42 bulges forward in the z direction.

Such a variation as described above can downsize an opening that allows the light L1 and the light L2 to pass through, in an electronic apparatus or the like in which the optical device A5 is mounted. The light-collecting effects of the light-emitting-side lens portion 41 and the light-receiving-side lens portion 42 can enhance the detection accuracy of the optical device A5.

Figure 16:
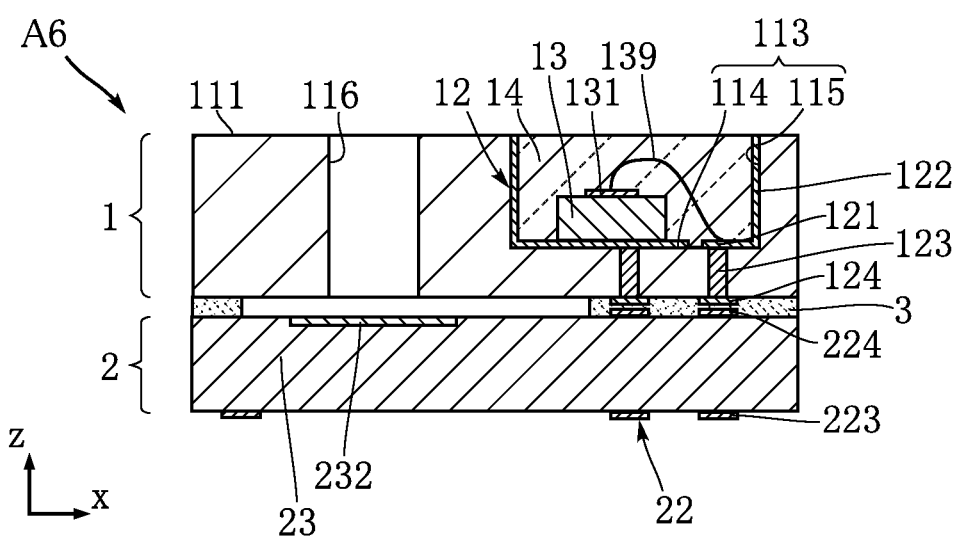
FIG. 16 is a cross-sectional view illustrating an optical device according to a sixth embodiment of the present invention.

FIG. 16 illustrates an optical device according to a sixth embodiment of the present invention. The illustrated optical device A6 differs from those in the above embodiments in that a light-receiving unit 2 is substantially composed of only a light-receiving element 23.

The light-receiving element 23 according to the present embodiment has substantially the same size as a light-emitting unit 1 (light-emitting-side base member 11) as viewed in the z direction. The light-receiving element 23 has a light receiver 232. The light receiver 232 overlaps with the light-emitting-side through hole 116 as viewed in the z direction.

The light-receiving element 23 is formed with a plurality of light-receiving-side reverse surface portions 223. These light-receiving-side reverse surface portions 223 are used as mounting terminals. Also, the light-receiving element 23 is formed with a plurality of light-receiving-side obverse surface portions 224. The plurality of light-receiving-side obverse surface portions 224 are electrically connected to a plurality of light-emitting-side reverse surface portions 124 of the light-emitting unit 1 via a bonding material 3. The electrical connection between the light-receiving-side reverse surface portions 223 and the light-receiving-side obverse surface portions 224 may be realized by a conductive path (not illustrated) formed within the light-receiving element 23, by a plating layer (not illustrated) formed on a side surface of the light-receiving element 23, or by some other means.

Such an embodiment as described above can downsize an opening that allows the light L1 and the light L2 to pass through, in an electronic apparatus or the like in which the optical device A6 is mounted. Also, the light-receiving unit 2 according to the present embodiment is composed of the light-receiving element 23 and does not include any light-receiving-side base member 21 as described above. This allows for downsizing the optical device A6.

The optical device according to the present invention is not limited to the embodiments as described above. Various design changes can be made to the specific configurations of the elements of the optical device according to the present invention.

The invention claimed is:

1. An optical device comprising:
a light-emitting unit that emits light forward in a first direction; and
a light-receiving unit arranged backward in the first direction relative to the light-emitting unit,
wherein the light-emitting unit comprises a light-emitting-side through hole that causes light traveling backward in the first direction to pass through, and the light-receiving unit comprises a light-receiving element provided with a light receiver that receives light having passed through the light-emitting-side through hole,
the light-emitting unit comprises:
a light-emitting-side base member having a light-emitting-side obverse surface that faces forward in the first direction, a light-emitting-side reverse surface that faces backward in the first direction, and a light-emitting-side recess recessed from the light-emitting-side obverse surface, the light-emitting-side recess having a light-emitting-side recess bottom surface that is spaced apart from the light-emitting-side reverse surface and faces forward in the first direction;
light-emitting-side wiring formed on the light-emitting-side base member; and
a light-emitting element housed in the light-emitting-side recess,
wherein the light-emitting-side through hole is connected to the light-emitting-side obverse surface and the light-emitting-side reverse surface,
the light-emitting-side wiring has a light-emitting-side through portion that extends from the light-emitting-side recess bottom surface to the light-emitting-side reverse surface through a thickness of the light-emitting-side base member,
the light-emitting-side wiring has a light-emitting-side reverse surface portion that is formed on the light-emitting-side reverse surface and electrically connected to the light-emitting-side through portion,
the light-emitting-side through hole has a first opening formed in the light-emitting-side obverse surface and a second opening formed in the light-emitting-side reverse surface, and the light-emitting-side recess has a third opening formed in the light-emitting-side obverse surface, the first opening being smaller in area than the third opening as viewed in plan, and
the light receiver of the light-receiving element is greater in area than the second opening of the light-emitting-side through hole.

2. The optical device according to claim 1, the light-emitting-side obverse surface and the light-emitting side reverse surface are perpendicular to the first direction.

3. The optical device according to claim 2, wherein the light-emitting-side recess has a light-emitting-side recess side surface that connects the light-emitting-side obverse surface and the light-emitting-side recess bottom surface.

4. The optical device according to claim 3, wherein the light-emitting-side recess side surface is parallel to the first direction.

5. The optical device according to claim 3, wherein the light-emitting-side recess side surface is inclined relative to the first direction.

6. The optical device according to claim 3, wherein the light-emitting-side wiring has a light-emitting-side bottom surface portion formed on the light-emitting-side recess bottom surface.

7. The optical device according to claim 6, wherein the light-emitting element is bonded to the light-emitting-side bottom surface portion.

8. The optical device according to claim 3, wherein the light-emitting-side wiring has a light-emitting-side side surface portion formed on the light-emitting-side recess side surface.

9. The optical device according to claim 3, wherein an inner surface of the light-emitting-side through hole is parallel to the first direction.

10. The optical device according to claim 3, wherein the inner surface of the light-emitting-side through hole is inclined relative to the first direction.

11. The optical device according to claim 3, wherein the light-emitting unit includes a light-emitting-side light-transmissive resin that fills the light-emitting-side recess, covers the light-emitting element, and transmits light from the light-emitting element.

12. The optical device according to claim 11, wherein the light-emitting-side light-transmissive resin comprises a light-emitting-side lens portion.

13. The optical device according to claim 11, wherein the light-emitting-side light-transmissive resin has a light-emitting-side inclined surface that is inclined relative to the light-emitting-side obverse surface.

14. The optical device according to claim 1, wherein the light-receiving unit comprises:
a light-receiving-side base member having a light-receiving-side obverse surface that faces forward in the first direction, a light-receiving-side reverse surface that faces backward in the first direction, and a light-receiving-side recess recessed from the light-receiving-side obverse surface; and
light-receiving-side wiring formed on the light-receiving-side base member,
the light-receiving element is housed in the light-receiving-side recess.

15. The optical device according to claim 14, wherein the light-receiving-side obverse surface and the light-receiving-side reverse surface are perpendicular to the first direction.

16. The optical device according to claim 15, wherein the light-receiving-side recess has a light-receiving-side recess bottom surface that faces forward in the first direction, and a light-receiving-side recess side surface that connects the light-receiving-side obverse surface and the light-receiving-side recess bottom surface.

17. The optical device according to claim 16, wherein the light-receiving-side recess side surface is parallel to the first direction.

18. The optical device according to claim 16, wherein the light-receiving-side wiring has a light-receiving-side bottom surface portion formed on the light-receiving-side recess bottom surface.

19. The optical device according to claim 18, wherein the light-receiving unit includes a light-receiving-side wire connecting the light-receiving element and the light-receiving-side bottom surface portion.

20. The optical device according to claim 19, wherein the light-receiving-side wiring has a light-receiving-side through portion that extends from the light-receiving-side recess to the light-receiving-side reverse surface.

21. The optical device according to claim 20, wherein the light-receiving-side wiring has a light-receiving-side reverse surface portion that is formed on the light-receiving-side reverse surface and electrically connected to the light-receiving-side through portion.

22. The optical device according to claim 16, wherein the light-receiving unit includes a light-receiving-side light-transmissive resin, and the light-transmissive resin fills the light-receiving-side recess, covers the light-receiving element, and transmits light that is to be received by the light receiver.

23. The optical device according to claim 22, wherein the light-receiving-side light-transmissive resin comprises a light-receiving-side lens portion.

24. The optical device according to claim 22, wherein the light-receiving-side light-transmissive resin has a light-receiving-side inclined surface that is inclined relative to the light-receiving-side obverse surface.

25. The optical device according to claim 22, wherein the light-receiving-side light transmissive resin comprises a through-hole portion that passes through the light-emitting-side through hole and is exposed at the light-emitting-side obverse surface.

26. The optical device according to claim 25, wherein the light-receiving-side light-transmissive resin comprises a light-receiving-side lens portion formed at a forward end of the through-hole portion in the first direction.

27. The optical device according to claim 25, wherein the light-receiving-side light-transmissive resin has a light-receiving-side inclined surface formed at a forward end of the through-hole portion in the first direction.

28. The optical device according to claim 14, further comprising a bonding material that bonds the light-emitting-side reverse surface of the light-emitting-side base member and the light-receiving-side obverse surface of the light-receiving-side base member, wherein a part of the bonding material is in direct contact with the light-emitting-side reverse surface portion of the light-emitting-side wiring.

29. The optical device according to claim 28, wherein the bonding material is an anisotropic conductive bonding material.

30. The optical device according to claim 28, wherein the bonding material is solder.

31. The optical device according to claim 1, further comprising a light-transmissive cover that is arranged forward in the first direction relative to the light-emitting-side base member, covers the light-emitting-side recess and the light-emitting-side through hole, and transmits light from the light-emitting element.

32. The optical device according to claim 31, wherein the light-transmissive cover comprises a light-emitting-side lens portion that transmits light from the light-emitting element.

33. The optical device according to claim 31, wherein the light-transmissive cover comprises a light-receiving-side lens portion that transmits light that travels toward the light-emitting-side through hole.

* * * * *